US012345741B2

(12) United States Patent
Wang et al.

(10) Patent No.: US 12,345,741 B2
(45) Date of Patent: Jul. 1, 2025

(54) WAFER INSPECTION METHOD AND INSPECTION APPARATUS

(71) Applicant: CHROMA ATE INC., Taoyuan (TW)

(72) Inventors: Tsun-I Wang, Taoyuan (TW); I-Shih Tseng, Taoyuan (TW); Min-Hung Chang, Taoyuan (TW); Tzu-Tu Chao, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 133 days.

(21) Appl. No.: 17/956,301

(22) Filed: Sep. 29, 2022

(65) Prior Publication Data

US 2023/0105201 A1 Apr. 6, 2023

Related U.S. Application Data

(60) Provisional application No. 63/251,245, filed on Oct. 1, 2021.

(51) Int. Cl.
*G01R 1/073* (2006.01)
*G01R 1/067* (2006.01)
*G01R 1/28* (2006.01)
*G01R 31/3185* (2006.01)

(52) U.S. Cl.
CPC ..... *G01R 1/07385* (2013.01); *G01R 1/06766* (2013.01); *G01R 1/28* (2013.01); *G01R 31/318511* (2013.01)

(58) Field of Classification Search
CPC ........ G01R 31/318511; G01R 1/06766; G01R 1/07385
See application file for complete search history.

(56) References Cited

U.S. PATENT DOCUMENTS

| 4,010,418 | A | * | 3/1977 | Salvatore | G01R 29/02 |
| | | | | | 324/762.08 |
| 6,292,342 | B1 | * | 9/2001 | Miyamoto | H02H 9/04 |
| | | | | | 361/91.1 |
| 11,018,681 | B1 | * | 5/2021 | Hamilton | H03M 1/0836 |
| 2003/0171883 | A1 | * | 9/2003 | Tseng | G09G 3/006 |
| | | | | | 702/64 |

(Continued)

OTHER PUBLICATIONS

Translation of JP2015118045A (Year: 2015).*

(Continued)

*Primary Examiner* — Paresh Patel
(74) *Attorney, Agent, or Firm* — WPAT, PC

(57) ABSTRACT

A wafer inspection method and inspection apparatus that perform a voltage inspection of a die on a wafer by a probe module. The probe module includes a processing module, a first probe coupled to a first electrode point of the die, and a second probe coupled to a second electrode point of the die. The first probe is coupled to the processing module, and the second probe is grounded. The processing module provides the die with a driving current through the first probe, and obtains an inspection voltage corresponding to the die. The processing module generates an inspection result of the inspection voltage based on two reference voltages respectively representing a high critical threshold value and a low critical threshold value of the die under a normal operation. The inspection result indicates an operating status of the die. Thus, inspection costs are reduced and inspection efficiency is enhanced.

3 Claims, 6 Drawing Sheets

(56) References Cited

U.S. PATENT DOCUMENTS

2003/0208711 A1\* 11/2003 Frame .............. G01R 31/31932
714/E11.17
2006/0123303 A1\* 6/2006 Frame .............. G01R 31/31937
714/742
2011/0121904 A1\* 5/2011 Kojima ................... G01R 1/36
330/284

OTHER PUBLICATIONS

Translation of WO2018091830A1 (Year: 2018).\*
Translation of KR 20130011948 A1 (Year: 2013).\*
Translation of JP 2013-024729 A (Year: 2013).\*

\* cited by examiner

WAFER INSPECTION METHOD AND INSPECTION APPARATUS

CROSS REFERENCE TO RELATED APPLICATIONS

The present application claims priority to U.S. Provisional Patent Application No. 63/251,245 filed on Oct. 1, 2021, the entire content of which is incorporated by reference to this application.

BACKGROUND OF THE INVENTION

Field of the Invention

The present invention relates to wafer inspections and, more particularly, to a wafer inspection method and inspection apparatus.

Description of the Prior Art

In wafer inspection, contacts are formed by probes and electrode points of dies, so as to perform electrical testing. Conventionally, regarding testing of each die on a wafer in wafer inspection, in addition to forming an electrical connection route for electrical testing between a probe and an electrode point of the corresponding die, it is also necessary to perform an electrical test procedure by a test device.

For example, after supplying power to a die, a test device reads a value of each die through a probe of a wafer inspection apparatus to obtain electrical values fed back by the die, further determining the quality of the die.

To reduce the total test time, all dies within a range need to be inspected simultaneously. However, since one die takes up one channel of the test device, one single test device is required to provide a larger number of channels or multiple test devices need to be used in order to complete such simultaneous inspection, resulting in increased test costs.

SUMMARY OF THE INVENTION

In some embodiments of the present disclosure, the issues of overly high inspection costs of wafers are solved.

In some embodiments of the present disclosure, inspection efficiency is enhanced.

According to some embodiments, a wafer inspection apparatus includes a probe module. The probe module includes a first probe, a second probe and a processing module. The first probe is provided to couple to a first electrode point of a die on a wafer. The second probe is provided to couple to a second electrode point of the die on the wafer. The first probe is coupled to the processing module, and the second probe is grounded. The processing module provides the die with a driving current through the first probe and the first electrode point, obtains a corresponding inspection voltage when the die is driven, and generates an inspection result of the inspection voltage based on two reference voltages. The two reference voltages respectively represent a high critical threshold value and a low critical threshold value of the die.

According to some embodiments, the processing module includes a driver, a comparing unit and a logic element. The driver is coupled to the first probe and provides a driving current. The comparing unit is coupled to the first probe and is for obtaining the inspection voltage. The comparing unit is for further comparing the inspection voltage based on the two reference voltages to generate the inspection result. The logic element is coupled to the comparing unit and is for storing the inspection result.

According to some embodiments, the comparing unit has a first comparator and a second comparator connected in parallel. Output terminals of the first comparator and the second comparator are coupled to the logic element. A first input terminal of the first comparator is coupled to the first probe. A first input terminal of the second comparator is coupled to the first probe. A second input terminal of the first comparator has one of the two reference voltages, and a second input terminal of the second comparator has the other of the two reference voltages.

According to some embodiments, a wafer inspection method includes a preparation step, an initial route establishing step and an inspection step. In the preparation step, a probe module is provided. The probe module includes a first probe, a second probe and a processing module. The first probe is coupled to the processing module, and the second probe is grounded. In the initial route establishing step, the first probe is coupled to a first electrode point of a die on a wafer, and the second probe is coupled to a second electrode point of the die, so that the die is disposed in a test loop between the processing module and the ground. In the inspection step, a driving current is provided through the first probe and the first electrode point by the processing module to the die disposed in the test loop, a corresponding inspection voltage of the die is obtained, and the processing module generates an inspection result of the inspection voltage based on two reference voltages. The two reference voltages respectively represent a high critical threshold value and a low critical threshold value of the die.

According to some embodiments, a wafer inspection apparatus for inspecting a plurality of dies within a matrix region on a wafer is provided. The wafer is laid out with a plurality of first layout lines, a plurality of second layout lines, a plurality of first contact pads correspondingly coupled to the plurality of first layout lines, respectively, and a plurality of second contact pads correspondingly coupled to the plurality of second layout lines, respectively. Each of the first layout lines couples to a first electrode point of each of the dies arranged in a same column, and each of the second layout lines couples to a second electrode point of each of the dies arranged in a same row. The wafer inspection apparatus includes a probe module. The probe module is for providing a driving route for each of the dies and providing a ground route for a selected die. The first route, the ground route and the selected die form a test loop in an inspection procedure. The probe module includes a plurality of first probes, a plurality of second probes, a plurality of processing modules correspondingly coupled to the first probes, respectively, and a switch group coupled between the second probes and a ground. Each of the first probes is provided for contacting corresponding one of the first contact pads in the inspection procedure, and each of the second probes is provided for contacting corresponding one of the second contact pads in the inspection procedure. The switch group is controlled to couple one of the second probes to the ground route, and causes the selected die to be disposed in the test loop. Each of the processing modules provides a driving current through the corresponding driving route to each of the dies, obtains a corresponding inspection voltage when each of the dies is coupled to the ground route through the switch group, and generates an inspection result of the inspection voltage based on two reference voltages, wherein the two reference voltages represent a high critical threshold value and a low critical threshold value of the die, respectively.

According to some embodiments, a test result is obtained by a control means of columns and rows formed by the combination of the processing module and the switches, and fast switching is performed on a wafer disposed with layout lines for connecting electrode points of dies in series, so as to input a current to a die under test, further at the same time complete electrical testing of the dies in the same column or the same row. Then, with switching of the switches, the dies in the next column or next row are then individually configured as test targets. Such column/row control means in a matrix form is performed by a simplified column/row control means, hence saving costs of a test apparatus.

DETAILED DESCRIPTION OF THE EMBODIMENTS

Objectives, features, and advantages of the present disclosure are hereunder illustrated with specific embodiments, depicted with drawings, and described below.

In the disclosure, descriptive terms such as "a" or "one" are used to describe the unit, component, structure, device, module, system, portion, section or region, and are for illustration purposes and providing generic meaning to the scope of the present invention. Therefore, unless otherwise explicitly specified, such description should be understood as including one or at least one, and a singular number also includes a plural number.

In the disclosure, descriptive terms such as "include, comprise, have" or other similar terms are not for merely limiting the essential elements listed in the disclosure, but can include other elements that are not explicitly listed and are however usually inherent in the units, components, structures, devices, modules, systems, portions, sections or regions.

In the disclosure, the terms similar to ordinals such as "first" or "second" described are for distinguishing or referring to associated identical or similar components or structures, and do not necessarily imply the orders of these components, structures, portions, sections or regions in a spatial aspect. It should be understood that, in some situations or configurations, the ordinal terms could be interchangeably used without affecting the implementation of the present invention.

The term "coupled" used herein refers to two or more elements or features being directly and physically in contact with each other, or indirectly and physically in contact with each other, or may refer to two or more elements or features operating or acting with each other or directly or indirectly electrically (by electricity or electrical signals) connected to each other.

Figure 1:
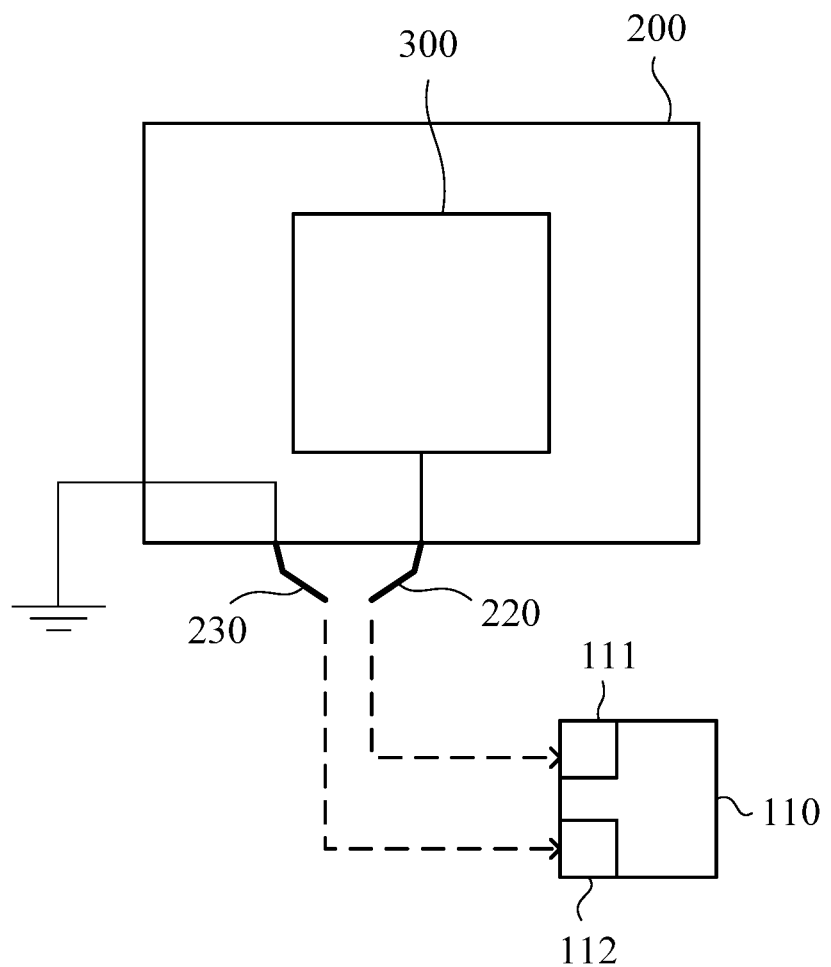
FIG. 1 is a schematic diagram of a wafer inspection apparatus according to some embodiments.
Figure 2:
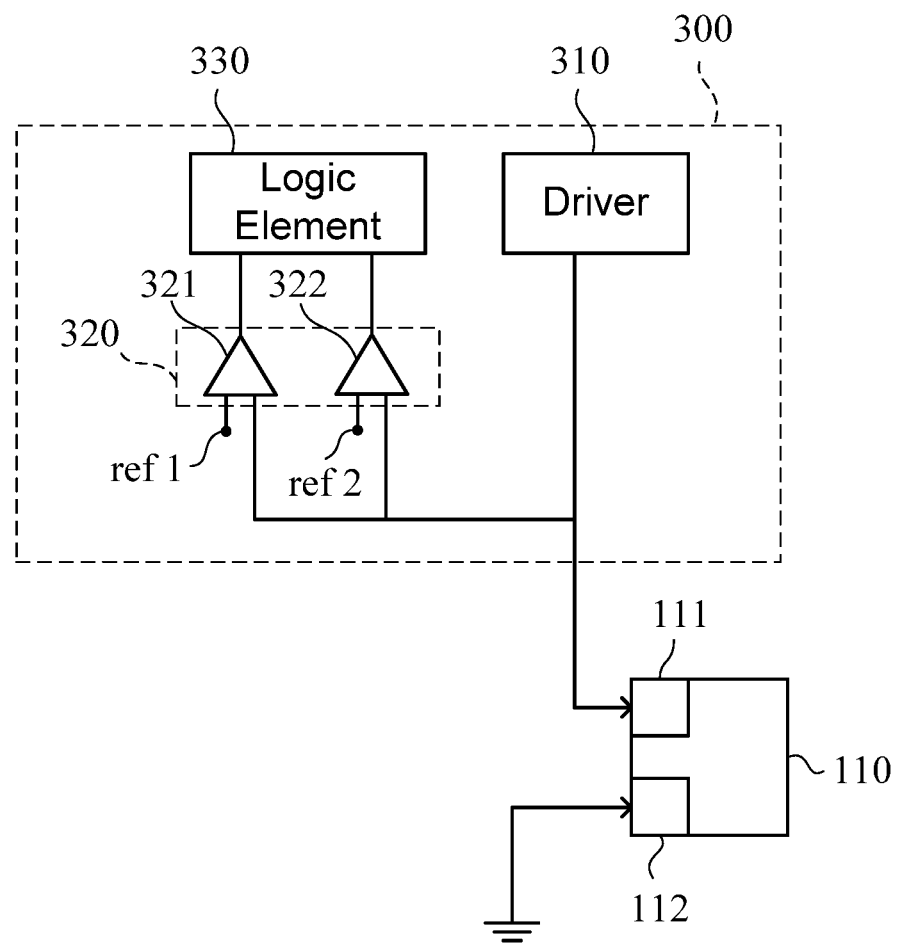
FIG. 2 is a schematic diagram of circuit routes during wafer inspection according to some embodiments.

Refer to FIG. 1 and FIG. 2. FIG. 1 shows a schematic diagram of a wafer inspection apparatus according to some embodiments. FIG. 2 shows a schematic diagram of circuit routes during wafer inspection according to some embodiments.

As shown in FIG. 1, a wafer inspection apparatus includes a probe module 200. The probe module 200 includes a first probe 220, a second probe 230 and a processing module 300. With the movement of the probe module 200 and the movement of a wafer or a collaborative operation of the two, the first probe 220 and the second probe 230 on the probe module 200 are enabled to be correspondingly coupled to a first electrode point 111 and a second electrode point 112 of a die 110.

In this embodiment, an electrical inspection of the die 110 is based on at least two reference voltages. Once the die 110 is correspondingly coupled through the first probe 220 and the second probe 230 and a route of a test loop is established, the die 110 that is driven in this route produces an influence on a voltage in the route based on attributes thereof. The die 110 operates within a corresponding voltage range, such that the voltage in the route is kept within a corresponding range, and a different voltage range can then be used to distinguish respective electrical performance statuses of individual dies.

For example, two reference voltages including a high threshold value and a low threshold value are set. The operating status of one die may render the voltage in the route to be (1) higher than or equal to the high threshold value, (2) lower than or equal to the low threshold value, or (3) between the high threshold value and the low threshold value. The status of the voltage is an inspection result. The performances of these three voltage statuses correspond to the attributes of a die, so that the die can be grouped according to the inspection result. For example, the three voltage performances above are divided into three categories for classifying the die under test. For another example, in one embodiment, when the voltage performance is in a voltage status that is higher than or equal to the high threshold value and lower than or equal to the low threshold value, it is considered that the die is in a special state (or in an abnormal state); when the voltage performance is in a voltage status that is between the high threshold value and the low threshold value, it is considered that the die is in a normal state.

In some embodiments, more reference voltages may be provided. For example, when there are three reference voltages (first to third critical threshold values), the voltage performance can be divided into four intervals (four categories); when there are four reference voltages (first to fourth critical threshold values), the voltage performance can be divided into five intervals (five categories), and so forth.

In some embodiments, by setting two reference voltages and obtaining an inspection voltage of the die 110, the operating status of this die can be quickly determined. The two reference voltages may correspond to a threshold value of the voltage status of a die that is driven. Borders of a range interval are defined as a high critical threshold value and a low critical threshold value; the inspection voltage of the die 110 falling within this interval indicates that the die belongs to a first category, and the inspection voltage falling outside this interval indicates that the die 110 belongs to a second category. In the configuration above, no external test device is needed to perform an electrical test procedure. Moreover, external test devices are very costly in general.

In some embodiments, the first category may be defined as a normal die, and the second category may be defined as an abnormal die.

As shown in FIG. 1 and FIG. 2, the processing module 300 includes a driver 310, a logic element 330 and a comparing unit 320. The driver 310 provides a driving current, which is supplied through the first probe 220 to the first electrode point 111 of the die 110. The comparing unit 320 is coupled to the first probe 220 and obtains the inspection voltage of the die 110. The comparing unit 320 compares the inspection voltage with two reference voltages ref1 and ref2 to generate the inspection result.

As shown in FIG. 2, the comparing unit 320 adopts, for example, two comparators connected in parallel, including a first comparator 321 and a second comparator 322, of which output terminals are coupled to the logic element 330. A first input terminal of the first comparator 321 is coupled to the first probe 220 (hence further coupled to the first electrode point 111), and a first input terminal of the second comparator 322 is similarly coupled to the first probe 220 (hence further coupled to the first electrode point 111). A second input terminal of the first comparator 321 has the reference voltage ref1, and a second input terminal of the second comparator 322 has the other reference voltage ref2. The logic element 330 coupled to the comparing unit 320 is used to store an inspection result (respective comparison results of the inspection voltage with respect to the reference voltages ref1 and ref2). In other embodiments, when there are more reference voltages provided, the number of comparators increases correspondingly.

Each of the comparators may determine the electrical status of a die based on a specific voltage value of the reference voltage. For example, assume that the reference voltage ref1 of one comparator is 2 V, and the reference voltage ref2 of the other comparator is 2.3 V. Thus, an inspection result (evaluating an interval of the inspection voltage) of whether the voltage of a die is between 2 V and 2.3 V, achieving a simple and effective test method capable of reducing costs of test apparatuses at the same time. The logic element 330 may be used to record the measured voltage, for example, whether the electrical status of a die is an electrical status that is smaller than or equal to 2 V, greater than or equal to 2.3 V, or between 2 V and 2.3 V. Specific category borders or definitions may be adjusted according to actual application conditions. For example, the intervals may be divided into "smaller than 2 V, equal to or between 2 V and 2.3 V, and greater than 2.3 V", or "smaller than 2 V, between 2 V and 2.3 V, and greater than 2.3 V".

For example, the logic element 330 may be a field programmable gate array (FPGA), which is used to record output signals of the comparing unit 320, wherein the output signals are, for example, binary signals (00, 01, 10 and 11).

Figure 3:
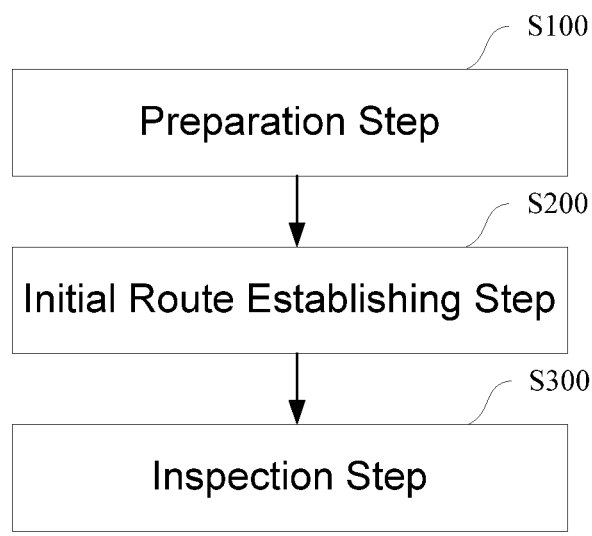
FIG. 3 is a flowchart of a wafer inspection method according to some embodiments.

Refer to FIG. 3 showing a flowchart of a wafer inspection method according to some embodiments. The wafer inspection method includes a preparation step S100, an initial route establishing step and an inspection step S300.

In the preparation step S100, the probe module 200 in the embodiment above is provided.

In the initial route establishing step S200, the first probe 220 of the probe module 200 is coupled to the first electrode point 111 of the die 110, and the second probe 230 is coupled to the second electrode point 112 of the die 110, so that the die 110 is disposed in a test loop between the processing module 300 and a ground.

In the inspection step S300, a driving current is provided by the processing module 300 to the die 110 disposed in the test loop, a corresponding inspection voltage of the die is obtained, and an inspection result of the inspection voltage is generated based on two reference voltages ref1 and ref2.

In some other embodiments, scanning in a matrix form is further used in coordination, so as to quickly switch to (and select) a die under inspection in a matrix region.

For example, in the manufacturing field of light emitting diodes (LED), one piece of wafer may contain millions of LED dies in the manufacturing of dies for mini LED sizes or dies for micro LED sizes. With some embodiments disclosed herein, the problems of overly high inspection costs and poor inspection efficiency of wafers can be solved.

Each of the LED dies has a P-electrode and an N-electrode for receiving a current. With part of transmission lines simultaneously laid out during the wafer manufacturing process, the P-electrodes or N-electrodes of individual dies of the same column or the same row can be connected in series. A location of these dies connected in series by the transmission lines is defined as a matrix region. Accordingly, when there are a smaller number of dies, one wafer may be defined with only one matrix region; however, for a larger number of dies, one wafer may be defined with a plurality of matrix regions.

Each transmission line laid out in each matrix region is for connecting the individual dies of the same column or the same row together in series. The transmission line refers to, for example, a transmission line that connects the P-electrodes or N-electrodes of individual dies of the same column together in series, or a transmission line that connects the P-electrodes or N-electrodes of individual dies of the same row together in series. For another example, among the dies arranged in the same column, when the P-electrodes of the dies are used to be coupled to a transmission line of one column, the N-electrodes of the dies of this column are used to be coupled to a transmission line of one row.

In some embodiments, a contact pad is laid out at one end of the transmission line. Such configuration is equivalent to transferring control points of the P-electrode or N-electrode of each of the dies to edges of the matrix region or edges of the wafer through the transmission line, hence achieving control of an entirety of one column or one row over the LED dies. On the other hand, transferring the contact pads to edges of a matrix region, or configuring the area of the contact pads on edges of a wafer to be slightly larger than the area of the P-electrode pad or the N-electrode pad of each of the dies, can be conducive to enhancing the precision of alignment contact of the probes of the probe module.

Figure 4:
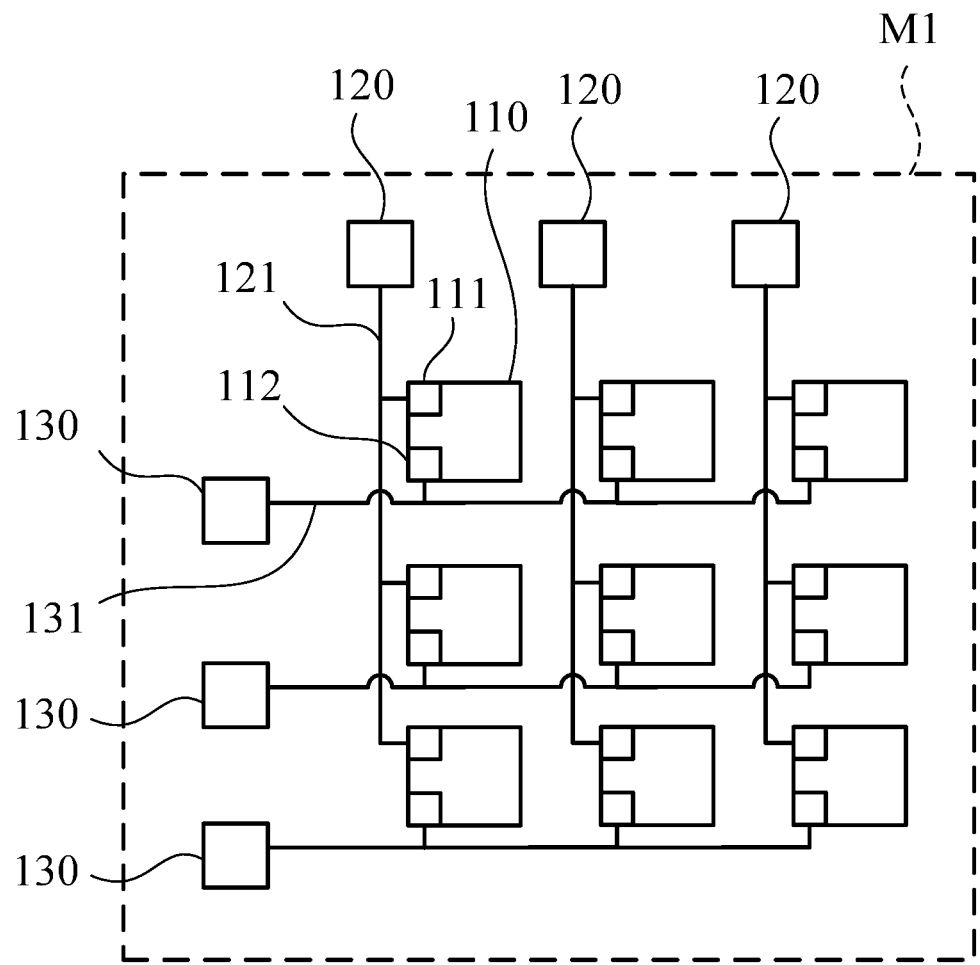
FIG. 4 is a circuit schematic diagram within a matrix region on a wafer according to some embodiments.

Refer to FIG. 4 showing a circuit schematic diagram within a matrix region on a wafer according to some embodiments.

As shown in FIG. 4, an example of a circuit layout within a 3*3 matrix region M1 on a wafer is illustrated. There are a total of nine dies 110 arranged in three columns and three rows within the matrix region M1. With the configuration of layout lines serving as transmission lines, within the matrix region M1, the first electrode points 111 of the dies 110 arranged in the same column are all connected to a corresponding first layout line 121, and the second electrode points 112 of the dies 110 arranged in the same row are all connected to a corresponding second layout line 131. Each first electrode point 111 is, for example, one of the P-electrode and N-electrode, and each second electrode point 112 is, for example, the other of the P-electrode and N-electrode. Moreover, each of the first layout lines 121 is connected to a corresponding first contact pad 120, and each of the second layout lines 131 is connected to a corresponding second contact pad 130.

Thus, each die 110 within the matrix region M1 may be controlled in a matrix manner through the corresponding first contact pad 120 and the corresponding second contact pad 130, further allowing a current to be easily individually input to the individual dies 110 in one specified row or column in the matrix region M1. After the inspection, the wafer undergoes a cutting process to separate the dies from one another. That is, the layout lines (the first layout line 121 and the second layout line 131) originally laid out on the wafer may also be separated from the die 110 after the cutting process.

In some embodiments, each matrix region M1 on the wafer is provided with the respective first contact pads 120 and second contact pads 130, and the wafer (or the probe card) is moved to allow the remaining matrix regions M1 to contact one after another in turn with the probe module, thus completing testing of all the dies on the wafer. In other embodiments, the first contact pads 120 and the second contact pads 130 may also be both disposed on edges of the wafer, so as to form one single wafer on which the first contact pads 120 and the second contact pads 130 are disposed only on two sides, instead of having the first contact pads 120 and the second contact pads 130 disposed on edges of every matrix region M1. Thus, an additional layout area needed on the wafer can be reduced; in other words, the wafer is defined with one single matrix region M1 thereon. Compared to the configuration in which one wafer is defined with a plurality of matrix regions M1 thereon, the number of probes that need to be configured on a probe module is larger in a configuration in which only one single matrix region M1 is defined.

Figure 5:
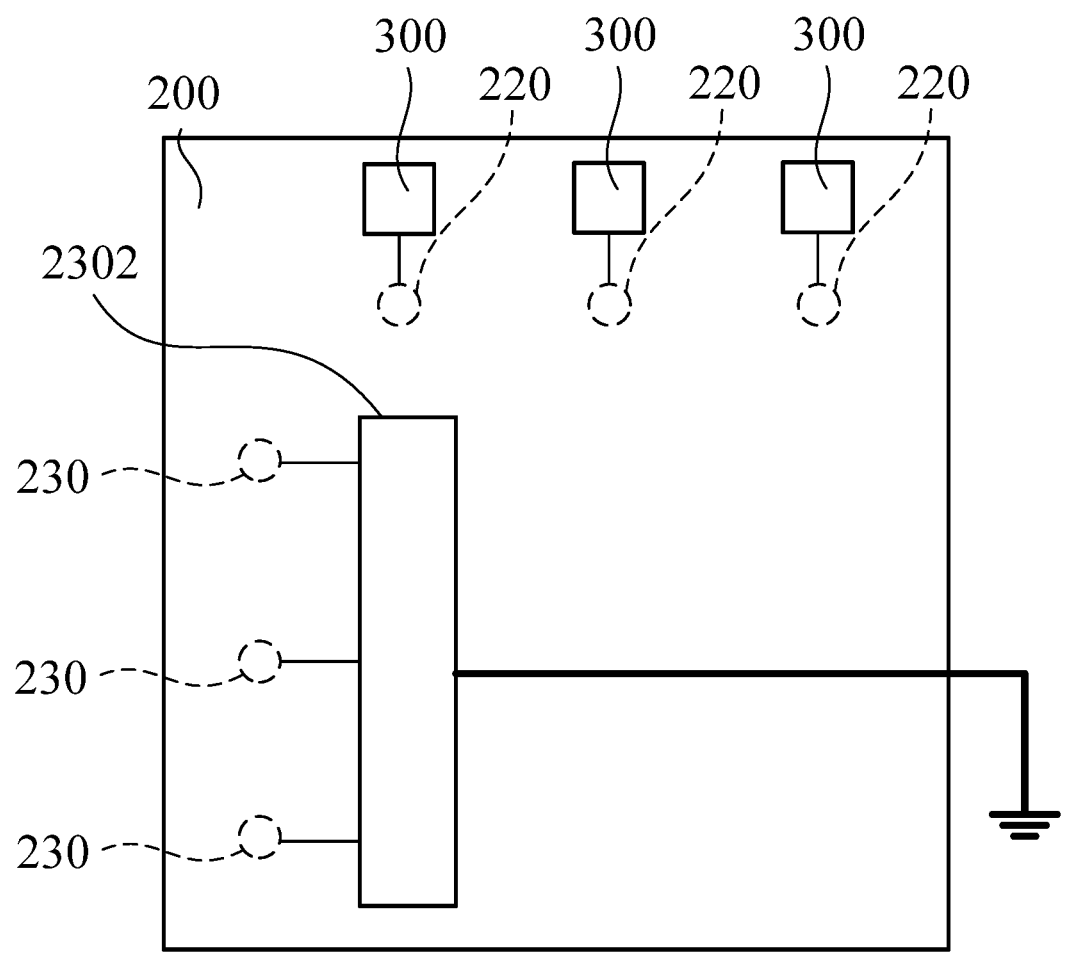
FIG. 5 is a schematic diagram of a probe module corresponding to the exemplary matrix region in FIG. 4.

Refer to FIG. 4 and FIG. 5. FIG. 5 shows a schematic diagram of a probe module corresponding to the exemplary matrix region M1 in FIG. 4. FIG. 5 shows a top schematic diagram in which the first probes 220 are depicted as probes extending downward (toward an inspection target). The probe module 200 in FIG. 5 is configured with a plurality of first probes 220 corresponding to the first contact pads 120 of the matrix region M1 in FIG. 4, and a plurality of second probes 230 corresponding to the second contact pads 130. These probes are for contacting with the corresponding pads during the inspection so as to form a coupling relationship and establish a test loop for the process of an inspection procedure. Each of the first probes 220 is connected to corresponding one of the processing modules 330, and each of the second probes 230 is connected to corresponding one of switches (for example, relays) in a switch group 2302. Whether a switch is turned on (a short-circuit or open-circuit state) determines whether the second probe 230 is coupled to the ground.

Each of the processing modules 300 provides, based on a current (not shown) provided externally, a current to the first electrode points 111 of the individual dies of the corresponding column, and determines, by controlling the individual switches, the second electrode points 112 of the dies 110 of which row are to form a coupling relationship with the ground (to further form a test loop). In other words, when the switch of a certain row is switched to a short-circuit state (turned on), the second electrode points 112 of the individual dies 110 of this row are coupled to the ground, and the dies 110 are equivalently at the same time disposed in a corresponding test loop for the process of a test procedure, further enabling the processing module 300 to obtain inspection results of the individual dies 110 of this row.

Within the matrix region M1, to switch to the dies 110 of the next row as test targets, only the switch group 2302 needs to be controlled to switch to and turn on a next switch (in a short-circuit state), while the remaining switches are all set to a turn-off (open-circuit) state, thus defining a selected row. The die 110 under inspection can also be correspondingly defined, so as to achieve the establishment of a test loop (or referred to as an electrical loop) of the die 110 under inspection.

For example, a connection route between each of the processing modules 300 and the die 110 may be defined as a driving route, and the connection route between the ground and the die 110 may be defined as a ground route by the switch group 2302. The probe module 200 provides the selected die 110 with the driving route and the ground route. The driving route, the ground route and the selected die form a test loop in the inspection procedure. A short-circuit (on) state of each switch enables the corresponding die to be coupled to the ground route, and an open-circuit (off) state of each switch enables the corresponding die to be disconnected from the ground route.

Figure 6:
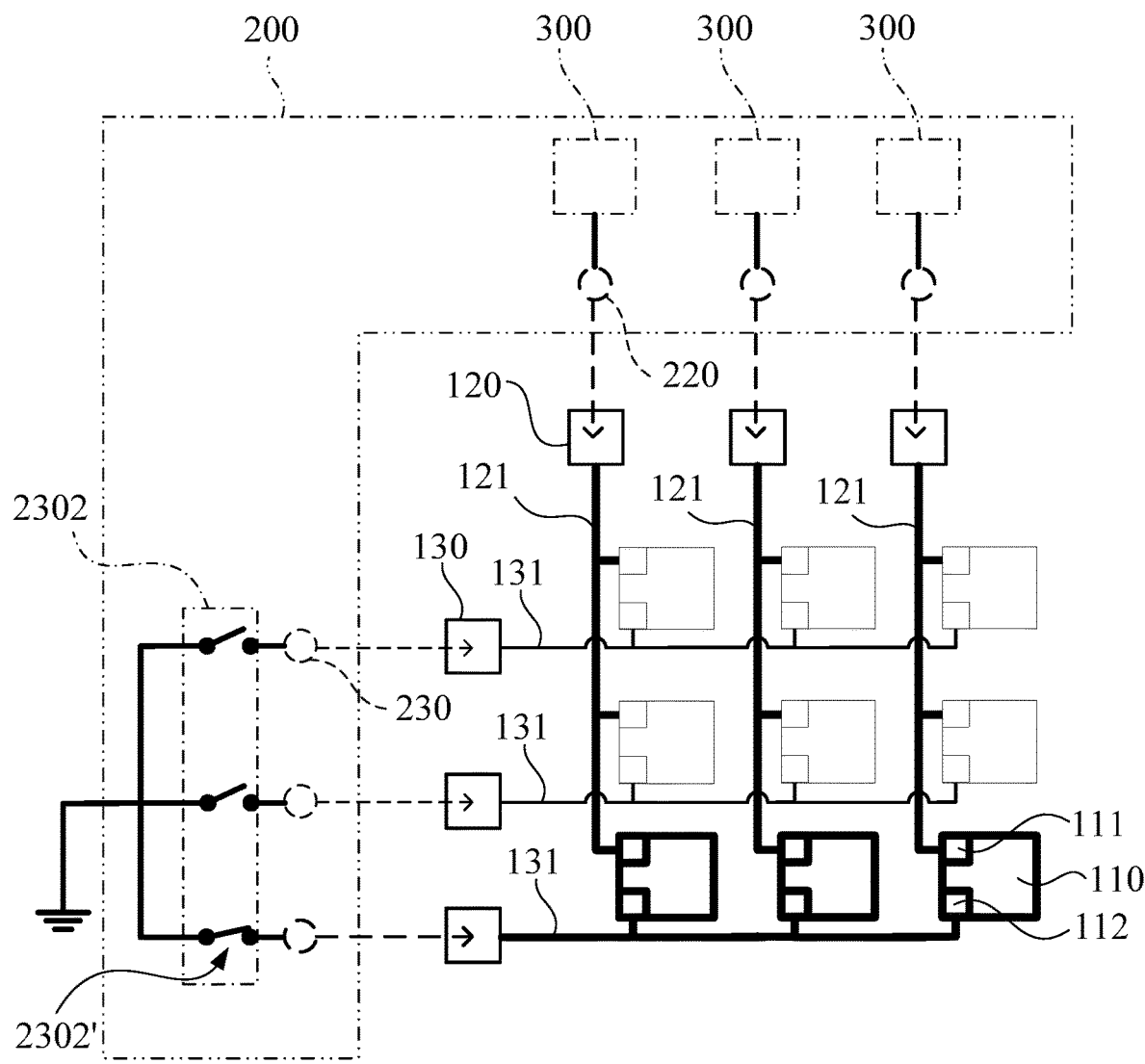
FIG. 6 is a schematic diagram of a test loop according to some embodiments

Refer to FIG. 6 showing a schematic diagram of a test loop according to some embodiments. The plurality of first contact pads 120, the plurality of second contact pads 130, the plurality of first layout lines 121 serving as column layout lines and the plurality of second layout lines 131 serving as row layout lines are disposed within one matrix region M1 on the wafer. The probe module 200 is configured with the plurality of processing modules 300, the plurality of first probes 220, the switch group 2302 (including the plurality of switches) and the plurality of second probes 230. Each of the first layout lines 121 couples to the first electrode points 111 of the individual dies 110 arranged in the same column, and each of the second layout lines 131 couples to the second electrode points 112 of the individual dies 110 arranged in the same row.

For illustration purposes, regarding the first probes 220 and the second probes 230 of the probe module 200 located above the wafer in the embodiment shown in FIG. 6, the corresponding relationship between the individual probes and the individual contact pads during a test process are indicated by arrows.

FIG. 6 shows control conditions of the individual processing modules 300 and the switch group 2302. Each of the processing modules 300 is coupled to the column layout line 121 of the corresponding column, and each of the processing modules 300 provides the column layout line 121 coupled thereto with a driving route. Each of the switches in the switch group 2302 can be independently controlled to be in a short-circuit (on) state or an open-circuit (off) state, so as to selectively provide a ground route.

During the inspection procedure, each of the processing modules 300 allows the corresponding first layout line 121 to be selected (depicted by a thick line in FIG. 6). A switch 2302' controlled to be short-circuit allows the corresponding second layout line 131 to be selected (depicted by a thick line in FIG. 6). Accordingly, the selected first layout line 121 and second layout line 131 enable the dies 110 arranged in the selected row to be disposed in the test loop, so as to simultaneously perform the test procedure on these dies 110. As shown in FIG. 6, the three dies 110 of the third row are simultaneously disposed in the respective test loops and can be tested simultaneously, further enhancing inspection efficiency.

Further, by controlling the short-circuit (on) state and the open-circuit (off) state of the switches in the switch group 2302, the dies 110 of which row are to be disposed in the test loop can be quickly determined, thus eliminating a moving process of one die after another in turn in conventional testing and significantly reducing the total test time needed.

For example, in conventional testing, the test time needed for one die is approximately 50 ms, and the time needed for moving the probes to a next die is approximately 150 ms, resulting in a total test time of approximately 200 ms per die. In terms of mini LEDs and micro LEDs that involve quantities of millions of dies, a total of 55.5 hours are needed to complete testing for one million dies.

In contrast, under the test configuration disclosed by the embodiments herein, for a matrix region set to be 100*100, based on the configuration of the processing modules 300 described above, the dies arranged in the same row can be simultaneously inspected at a test time of approximately 50 ms, the time for moving the probe module (to a next matrix region) is approximately 200 ms, and the time for scanning (switching) of each switch in the switch group is approximately 1 ms. Thus, for ten thousand dies within the 100*100 matrix region, the average test time needed for one die is reduced to only approximately ((50+1)*100+200)/(100*100)=0.53 ms.

Taking a piece of wafer having one million dies for example, the total test time is only approximately 8.8 minutes, and this significantly reduces the test time needed compared to 55.5 hours needed by a conventional test procedure. The calculation equation for the example (the matrix region includes ten thousand dies) above is: ((50+1)*100+200)/10000, and this yields a result of merely approximately 0.53 ms per die (inspection target). Thus, the embodiments disclosed herein reduces inspection costs while enhances inspection efficiency.

The present disclosure is illustrated by various aspects and embodiments. However, persons skilled in the art understand that the various aspects and embodiments are illustrative rather than restrictive of the scope of the present disclosure. After perusing this specification, persons skilled in the art may come up with other aspects and embodiments without departing from the scope of the present disclosure. All equivalent variations and replacements of the aspects and the embodiments must fall within the scope of the present disclosure. Therefore, the scope of the protection of rights of the present disclosure shall be defined by the appended claims.

What is claimed is:

1. A wafer inspection apparatus, comprising:
   a probe module, comprising a first probe, a second probe and a processing module, the first probe provided to couple to a first electrode point of a die on a wafer, the second probe provided to couple to a second electrode point of the die on the wafer, the first probe coupled to the processing module, the second probe being grounded;
   wherein, the processing module provides the die with a driving current through the first probe and the first electrode point, obtains a corresponding inspection voltage when the die is driven, and generates an inspection result of the inspection voltage based on at least two reference voltages,
   wherein, the two reference voltages respectively represent a high critical threshold value and a low critical threshold value of the die, and by separately comparing the inspection voltage with each of the two reference voltages, two corresponding comparison results are obtained, wherein the two comparison results are used to determine which category among a plurality of categories the die belongs to, thereby defining the inspection result,
   wherein the categories include a first category where the inspection voltage is greater than the low critical threshold and less than the high critical threshold, and a second category where the inspection voltage is greater than or equal to the high critical threshold or less than or equal to the low critical threshold,
   wherein the processing module comprises:
   a driver, coupled to the first probe and providing the driving current;
   a comparing unit, coupled to the first probe, and configured to obtain the inspection voltage and compare the inspection voltage with each of the two reference voltages respectively to obtain the two comparison results; and
   a logic element, coupled to the comparing unit, and configured to store the two comparison results and define the inspection result based on whether the die belongs to the first category or the second category, wherein the die is determined as being in a normal state when belonging to the first category and in an abnormal state when belonging to the second category.

2. The wafer inspection apparatus according to claim 1, wherein the comparing unit has a first comparator and a second comparator connected in parallel, output terminals of the first comparator and the second comparator are coupled to the logic element, a first input terminal of the first comparator is coupled to the first probe, a first input terminal of the second comparator is coupled to the first probe, a second input terminal of the first comparator has one of the two reference voltages, and a second input terminal of the second comparator has the other of the two reference voltages.

3. A wafer inspection method, comprising:
   a preparation step of providing a probe module, wherein the probe module comprises a first probe, a second probe and a processing module, the first probe is coupled to the processing module, and the second probe is grounded, and the processing module comprises a driver, a comparing unit and a logic element;
   an initial route establishing step of coupling the first probe to a first electrode point of a die on a wafer, and coupling the second probe to a second electrode point of the die, so that the die is disposed in a test loop between the processing module and the ground; and
   an inspection step of providing a driving current through the first probe and the first electrode point to the die disposed in the test loop by the driver of the processing module, obtaining a corresponding inspection voltage of the die by the comparing unit of the processing module, and generating an inspection result of the inspection voltage based on two reference voltages by the logic element of the processing module,
   wherein, the two reference voltages respectively represent a high critical threshold value and a low critical threshold value of the die, and by separately comparing the inspection voltage with each of the two reference voltages, two corresponding comparison results are obtained, wherein the two comparison results are used to determine which category among a plurality of categories the die belongs to, thereby defining the inspection result, wherein the categories include a first category where the inspection voltage is greater than the low critical threshold and less than the high critical threshold, and a second category where the inspection voltage is greater than or equal to the high critical threshold or less than or equal to the low critical threshold, wherein the logic element is coupled to the comparing unit to store the two comparison results and define the inspection result based on whether the die belongs to the first category or the second category, wherein the die is determined as being in a normal state when belonging to the first category and in an abnormal state when belonging to the second category.

* * * * *